US012604473B2

(12) United States Patent
Kim et al.

(10) Patent No.: US 12,604,473 B2
(45) Date of Patent: Apr. 14, 2026

(54) SEMICONDUCTOR DEVICE AND MANUFACTURING METHOD THEREOF

(71) Applicant: SK hynix Inc., Gyeonggi-do (KR)

(72) Inventors: Hyun Sub Kim, Gyeonggi-do (KR); Sun Woo Kim, Gyeonggi-do (KR); Jin Ho Bin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 433 days.

(21) Appl. No.: 18/104,711

(22) Filed: Feb. 1, 2023

(65) Prior Publication Data

US 2024/0090218 A1 Mar. 14, 2024

(30) Foreign Application Priority Data

Sep. 8, 2022 (KR) ......................... 10-2022-0114110

(51) Int. Cl.

| | |
|---|---|
| *H01L 23/528* | (2006.01) |
| *H01L 29/76* | (2006.01) |
| *H10B 41/27* | (2023.01) |
| *H10B 43/27* | (2023.01) |
| *H10B 63/00* | (2023.01) |
| *H10N 70/00* | (2023.01) |

(52) U.S. Cl.
CPC ......... *H10B 43/27* (2023.02); *H01L 23/5283* (2013.01); *H10B 41/27* (2023.02); *H10B*

*63/84* (2023.02); *H10N 70/011* (2023.02); *H10N 70/883* (2023.02)

(58) Field of Classification Search
CPC ................................ H10B 41/27; H10B 43/27
See application file for complete search history.

(56) References Cited

U.S. PATENT DOCUMENTS

2019/0312035 A1* 10/2019 Takuma .............. H01L 23/5283

FOREIGN PATENT DOCUMENTS

| | | |
|---|---|---|
| KR | 10-2020-0015219 A | 2/2020 |
| KR | 10-2021-0029870 A | 3/2021 |

OTHER PUBLICATIONS

Office Action for Korean Patent Application No. 10-2022-0114110 issued by the Korean Patent Office on Oct. 28, 2025.

* cited by examiner

*Primary Examiner* — John A Bodnar
(74) *Attorney, Agent, or Firm* — IP & T GROUP LLP

(57) ABSTRACT

A semiconductor device may include a gate structure, a channel structure extending through the gate structure, a first hydrogen supply layer disposed on the gate structure, having a first hydrogen concentration, and comprising an oxygen vacancy, and a hydrogen blocking layer disposed on the first hydrogen supply layer and having a second hydrogen concentration lower than the first hydrogen concentration.

14 Claims, 16 Drawing Sheets

SEMICONDUCTOR DEVICE AND MANUFACTURING METHOD THEREOF

CROSS-REFERENCE TO RELATED APPLICATION

This application claims priority under 35 U.S.C. § 119 to Korean Patent Application No. 10-2022-0114110 filed on Sep. 8, 2022, which is incorporated herein by reference in its entirety.

BACKGROUND

1. Technical Field

Various embodiments of the present invention disclosure relate to an electronic device and a manufacturing method thereof and, more particularly, to a semiconductor device and a manufacturing method thereof.

2. Related Art

The degree of integration of a semiconductor device is mainly determined by the area occupied by the unit memory cell. Recently, as improvements in the degree of integration of a semiconductor device for forming memory cells in a single layer on a substrate have reached a limit, three-dimensional semiconductor devices which stack memory cells over substrate have been proposed. Furthermore, for improving the operational reliability of such three-dimensional semiconductor devices, various structures and manufacturing methods have been developed. However, further improvements are needed to satisfy an ever increasing demand for smaller, faster, and more reliable electronic devices consuming less energy.

SUMMARY

The present invention provides an improved three-dimensional semiconductor device, hereinafter referred to simply as a semiconductor device.

In some embodiments, a semiconductor device may include: a gate structure; a channel structure extending through the gate structure; a first hydrogen supply layer disposed on the gate structure, having a first hydrogen concentration, and comprising an oxygen vacancy; and a hydrogen blocking layer disposed on the first hydrogen supply layer and having a second hydrogen concentration lower than the first hydrogen concentration.

In some embodiments, a semiconductor device may include: a gate structure; a channel structure extending through the gate structure; a first hydrogen supply layer disposed on the gate structure and having a first hydrogen concentration; a hydrogen blocking layer disposed on the first hydrogen supply layer and having a second hydrogen concentration lower than the first hydrogen concentration; and a second hydrogen supply layer disposed between the first hydrogen supply layer and the hydrogen blocking layer and having a third hydrogen concentration higher than the second hydrogen concentration.

In some embodiments, a manufacturing method of a semiconductor device may include: forming a stack comprising a channel structure; forming a first hydrogen supply layer comprising an oxygen vacancy on the stack; forming a hydrogen blocking layer on the first hydrogen supply layer; and annealing the hydrogen blocking layer and the first hydrogen supply layer.

In some embodiments, a manufacturing method of a semiconductor device may include: forming a stack comprising a channel structure; forming a first hydrogen supply layer on the stack; forming a second hydrogen supply layer on the first hydrogen supply layer; forming a hydrogen blocking layer on the second hydrogen supply layer; and annealing the hydrogen blocking layer, the second hydrogen supply layer, and the first hydrogen supply layer.

DETAILED DESCRIPTION

Various embodiments of the present invention disclosure are directed to a semiconductor device having an improved stable structure and improved characteristics. Various embodiments of the present invention disclosure are directed to a manufacturing method of the semiconductor device.

According to the present technology, it is possible to provide a semiconductor device having a stable structure and improved reliability.

Hereafter, embodiments in accordance with the technical spirit of the present invention disclosure will be described with reference to the accompanying drawings.

Figure 1A:
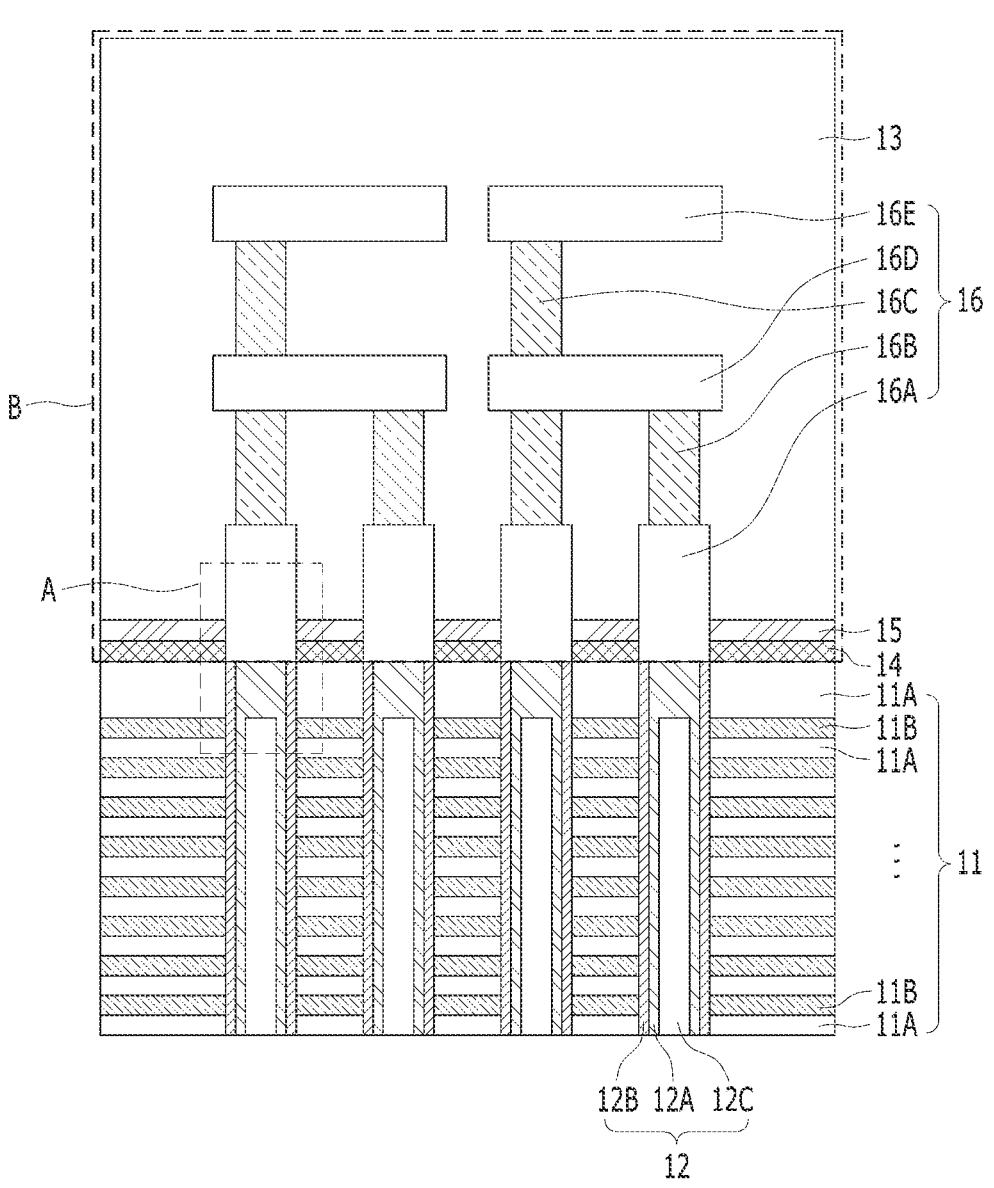
FIG. 1A to FIG. 1C are simplified schematic diagrams illustrating the structure of a semiconductor device in accordance with an embodiment.
Figure 1B:
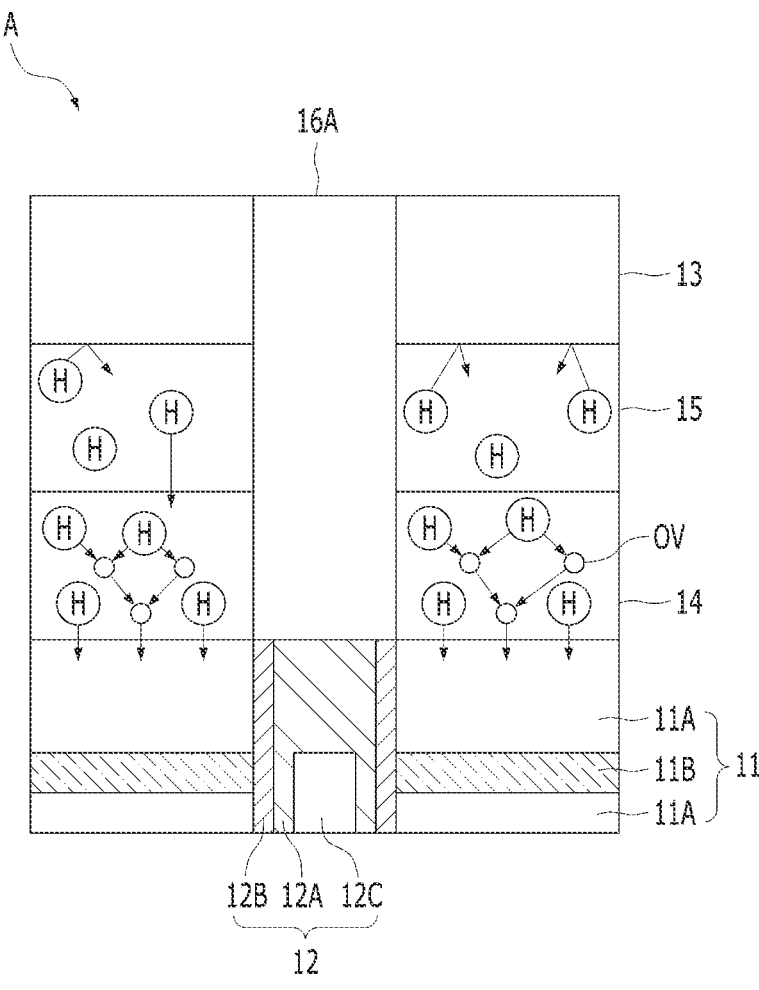
Figure 1C:
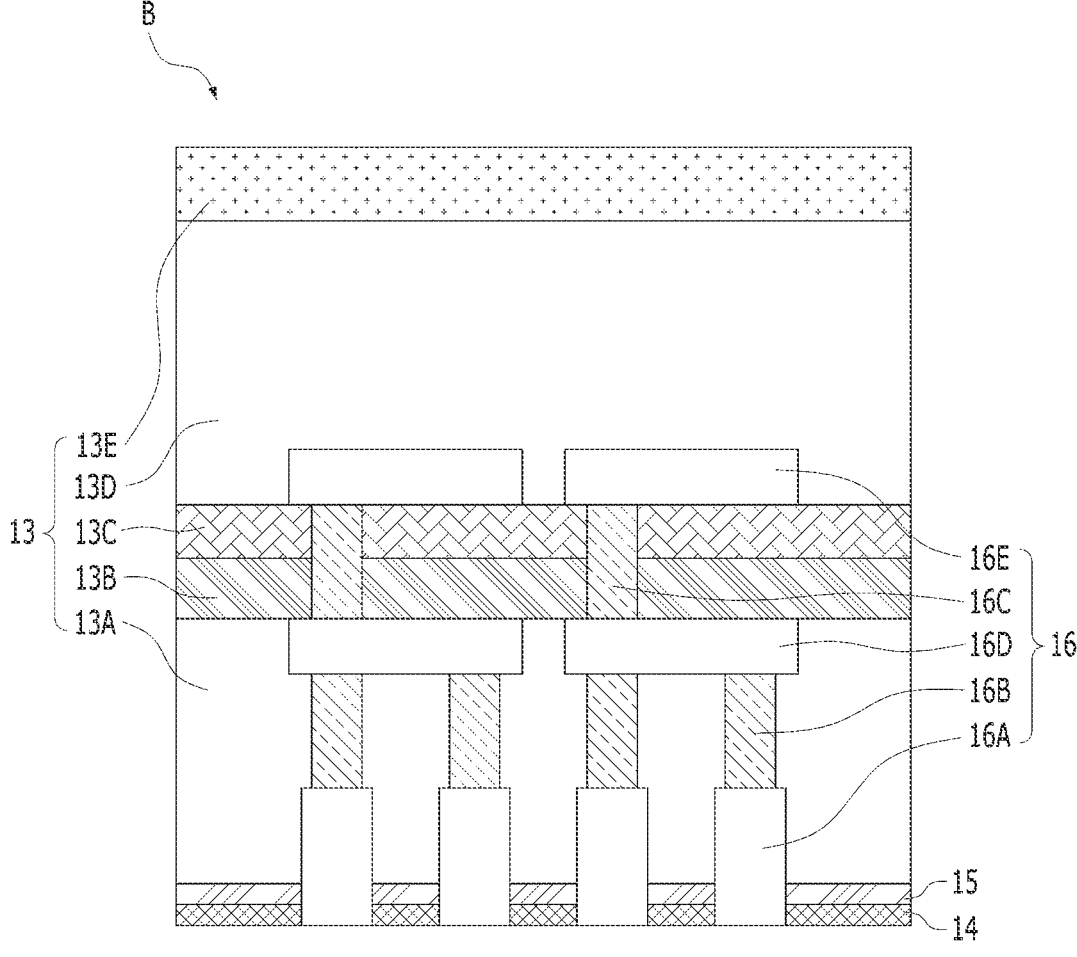

FIG. 1A to FIG. 1C are simplified schematic diagrams illustrating the structure of a semiconductor device in accordance with an embodiment.

Referring to FIG. 1A, the semiconductor device may include a gate structure 11, channel structures 12, a hydrogen supply layer 14, or a hydrogen blocking layer 15, or a combination thereof. The semiconductor device may further include an interlayer dielectric layer 13 as shown in FIG. 1B. In a variation of the illustrated embodiment as shown in FIG. 1C, the semiconductor device may include an interconnection structure 16. In some embodiments, the semiconductor device may include an interlayer dielectric layer 13 and an interconnection structure 16.

The gate structure 11 may include an insulating layer 11A and a conductive layer 11B. For example, as shown in FIG. 1B, the gate structure 11 may include insulating layers 11A and a conductive layer 11B that are alternately stacked. For example, the conductive layer or layers 11B may be word lines. As another example, the conductive layer or layers 11B may be word lines or select lines.

Each channel structure 12 may pass through the gate structure 11. For example, each channel structure 12 may extend in the stacking direction of the insulating and conductive layers 11A and 11B through the gate structure 11.

Each channel structure 12 may include a channel layer 12A and a memory layer 12B surrounding a sidewall of the channel layer 12A. Each channel structure 12 may further include an insulating core 12C in the channel layer 12A. The channel layer 12A may include a semiconductor material. For example, the channel layer 12A may include a semiconductor material such as silicon or germanium. The memory layer 12B may include a tunneling layer, a data storage layer, or a blocking layer, or a combination thereof. The data storage layer may include a floating gate, a polysilicon layer, a charge trap material, a nitride layer, a variable resistance material, or the like. The insulating core 12C may include an insulating material. For example, the insulating core 12C may include an insulating material such as an oxide, or a nitride. In some embodiments, the insulating core 12C may include a gap. The gap may be an air gap.

In some embodiments, the semiconductor device may also include electrode structures instead of the channel structures 12. Each electrode structure may include an electrode layer passing through the gate structure 11, and may further include a memory layer surrounding an outer wall or an inner wall of the electrode layer. The memory layer may include a variable resistance material.

The hydrogen supply layer 14 may be disposed on the gate structure 11. In an embodiment, the hydrogen supply layer 14 may be disposed on the topmost insulating layer 11A, e.g., the second insulating layer 11A in the embodiment of FIG. 1B. The hydrogen supply layer 14 may serve to passivate defects existing in peripheral layers. The hydrogen supply layer 14 may include hydrogen as a passivation source, and supply hydrogen to the gate structure 11, the channel structure 12, or the electrode structures. The hydrogen supplied to the gate structure 11 or the channel structure 12 may reduce defects such as dangling bonds. The hydrogen supply layer 14 may have a first hydrogen concentration. The hydrogen supply layer 14 may include oxide, nitride, or oxynitride, or a combination thereof.

The hydrogen supply layer 14 may include an oxygen vacancy OV. For example, the oxygen vacancy OV may be formed in the hydrogen supply layer 14 by annealing the hydrogen supply layer 14 to release oxygen included in the hydrogen supply layer 14. The oxygen vacancy OV may serve as a passage for supplying hydrogen to the gate structure 11, the channel structure 12, or the electrode structures. Referring to FIG. 1B, hydrogen (H) in the hydrogen supply layer 14 may be supplied to the gate structure 11, the channel structure 12, or the electrode structures through the oxygen vacancy OV. By using the oxygen vacancy OV as a movement path of the hydrogen (H), the hydrogen (H) may be efficiently supplied.

The hydrogen blocking layer 15 may be disposed on the hydrogen supply layer 14. The hydrogen blocking layer 15 serves to restrict a hydrogen movement path. The hydrogen blocking layer 15 may include an oxygen vacancy at a lower concentration than the hydrogen supply layer 14 or might not include the oxygen vacancy. Therefore, movement of hydrogen in the hydrogen supply layer 14 to the interlayer dielectric layer 13 may be minimized or prevented. Referring to FIG. 1B, the hydrogen blocking layer 15 may be disposed on the hydrogen supply layer 14 to prevent the hydrogen (H) included in the hydrogen supply layer 14 from diffusing into the interlayer dielectric layer 13.

The hydrogen blocking layer 15 may include hydrogen and have a second hydrogen concentration. The second hydrogen concentration may be substantially the same as or different from the first hydrogen concentration. For example, the second hydrogen concentration may be lower than the first hydrogen concentration. Referring to FIG. 1B, the hydrogen (H) included in the hydrogen blocking layer 15 may be moved to the hydrogen supply layer 14, and supplied to the gate structure 11, the channel structure 12, or the electrode structures through the oxygen vacancies OV in the hydrogen supply layer 14. In some embodiments, the hydrogen blocking layer may include nitride. For example, in some embodiments, the hydrogen supply layer 14 may include oxide, and the hydrogen blocking layer 15 may include nitride. As another example, in some embodiments, the hydrogen supply layer 14 may include oxynitride or nitride, and the hydrogen blocking layer 15 may include nitride.

The interconnection structure 16 may be disposed on the gate structure 11. The interconnection structure 16 may be connected to the channel structures 12 or the electrode structures, and may supply a bias required for a program, read, or erase operation. The interconnection structure 16 may be located in the interlayer dielectric layer 13. The interconnection structure 16 may include contact plugs 16A to 16C or wiring lines 16D and 16E, or a combination thereof.

Each of the first contact plugs 16A may be connected to the channel structures 12 by passing through the hydrogen blocking layer and the hydrogen supply layer 14. For example, each of the first contact plugs 16A may be connected to the channel structures 12 by extending through the hydrogen blocking layer 15 and the hydrogen supply layer 14. Each of the second contact plugs 16B may connect the first contact plug 16A with a first wiring line 16D. Each of the third contact plugs 16C may connect the first wiring line 16D with a second wiring line 16E. Each of the first wiring lines 16D may connect a plurality of the second contact plugs 16B, for example, two second contact plugs 16B with a corresponding one of the third contact plugs 16C. The first, second, and third contact plugs 16A, 16B and 16C and the first and second wiring lines 16D and 16E may each be a conductive line made of or including a conductive material such as aluminum, copper, tungsten or any combinations thereof.

The interlayer dielectric layer 13 may be disposed on the gate structure 11. The interconnection structure 16 may be located in the interlayer dielectric layer 13 with a part of the interconnection structure 16, i.e., the first contact plugs 16A passing through the hydrogen blocking layer 15 and the hydrogen supply layer 14. The interlayer dielectric layer 13 may be a single layer. The interlayer dielectric layer 13 may be a multilayer. Referring to FIG. 1C, the interlayer dielectric layer 13 may include a first interlayer dielectric layer 13A, a second interlayer dielectric layer 13B, a third interlayer dielectric layer 13C, a fourth interlayer dielectric layer 13D, or a fifth interlayer dielectric layer 13E, or a combination thereof. The first to fifth interlayer dielectric layers 13A to 13E may be sequentially stacked or arbitrarily stacked.

The first interlayer dielectric layer 13A may be disposed on the hydrogen blocking layer 15. The second contact plugs 16B may extend inside the first interlayer dielectric layer 13A from respective bottom surfaces of the first wiring lines 16D to the top surfaces of the corresponding first contact plugs 16A. The first wiring line 16D may be disposed at an upper portion of the first interlayer dielectric layer 13A with the top surface of the first wiring line 16D being at the same level as the top surface of the first interlayer dielectric layer 13A. The second interlayer dielectric layer 13B may be disposed on the first interlayer dielectric layer 13A. The third interlayer dielectric layer 13C may be disposed on the second interlayer dielectric layer 13B. The third contact plugs 16C may pass through the second interlayer dielectric layer 13B and the third interlayer dielectric layer 13C. The third contact plugs 16C may extend between the first and second wiring lines 16D and 16 E. The fourth interlayer dielectric layer 13D may be disposed on the third interlayer dielectric layer 13C. The second wiring line 16E may be located in the fourth interlayer dielectric layer 13D, and, in particular at a bottom portion of the fourth interlayer dielectric layer 13D with the bottom surface of the second wiring line 16E being at the same level as the bottom surface of the fourth interlayer dielectric layer 13D. The fifth interlayer dielectric layer 13E may be disposed on the fourth interlayer dielectric layer 13D.

The first interlayer dielectric layer 13A, the second interlayer dielectric layer 13B, the third interlayer dielectric layer 13C, the fourth interlayer dielectric layer 13D, or the fifth interlayer dielectric layer 13E may include an insulating material such as oxide or nitride. For example, the second interlayer dielectric layer 13B may be a capping layer and may include nitride. The third interlayer dielectric layer 13C may include tetraethyl orthosilicate (TEOS). The fourth interlayer dielectric layer 13D may include oxide formed by a high density plasma (HDP) method. The fifth interlayer dielectric layer 13E may be a passivation layer and may include silicon nitride.

According to the structure described above, the hydrogen supply layer 14 may include the hydrogen (H) and the oxygen vacancy OV. Since the oxygen vacancy OV may serve as a passage for supplying hydrogen, hydrogen in the hydrogen supply layer 14 may be supplied to the gate structure 11, the channel structure 12, or the electrode structures through the oxygen vacancy OV.

Furthermore, the hydrogen supply layer 14 may be located adjacent to the gate structure 11 and the channel structure 12, and the hydrogen blocking layer 15 for preventing hydrogen from diffusing into the interlayer dielectric layer 13 may be disposed on the hydrogen supply layer 14, so that hydrogen may be effectively supplied to the gate structure 11 or the channel structure 12. Accordingly, defects in the gate structure 11 or the channel structure 12 may be passivated with hydrogen, and operating characteristics of the semiconductor device may be improved by improving a cell current, a cell distribution, or the like.

Figure 2A:
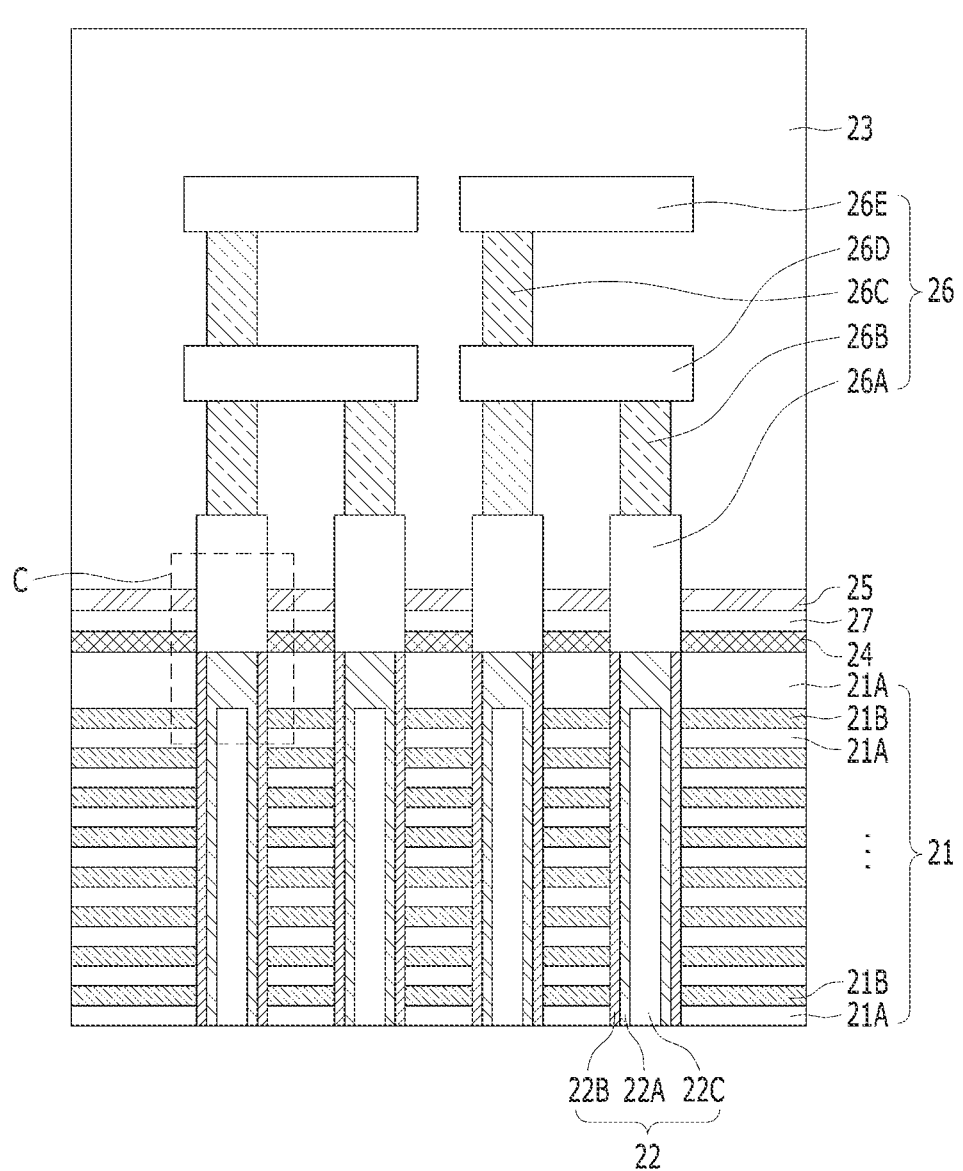
FIG. 2A and FIG. 2B are simplified schematic diagrams illustrating the structure of a semiconductor device in accordance with an embodiment.
Figure 2B:
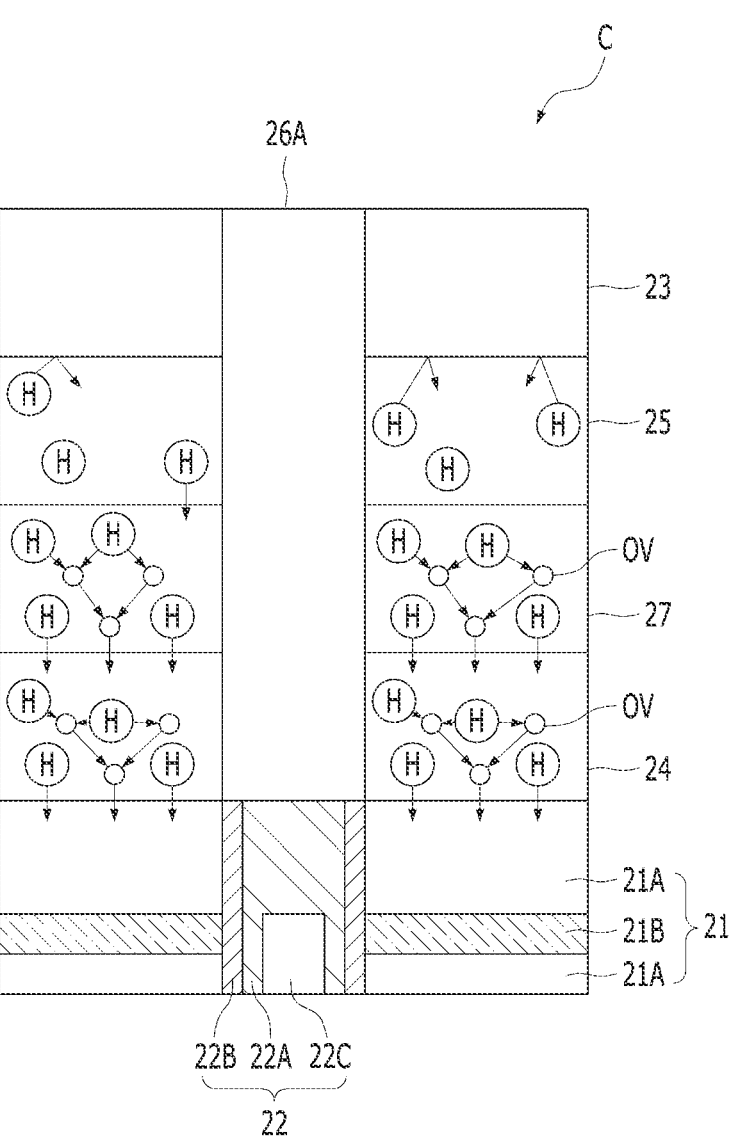

FIG. 2A and FIG. 2B are simplified schematic diagrams illustrating the structure of a semiconductor device in accordance with an embodiment. Hereinafter, content overlapping the previously described content may be omitted.

Referring to FIG. 2A and FIG. 2B, the semiconductor device may include a gate structure 21, channel structures 22, a first hydrogen supply layer 24, a second hydrogen supply layer 27, or a hydrogen blocking layer 25, or a combination thereof. The semiconductor device may further include an interlayer dielectric layer 23 or an interconnection structure 26, or a combination thereof.

The first hydrogen supply layer 24 may be disposed on the gate structure 21. The gate structure 21 may include insulating layers 21A and conductive layers 21B that are alternately stacked. The channel structure 22 may extend in the stacking direction of the insulating layers 21A through the gate structure 21. The channel structure 22 may include a channel layer 22A, a memory layer 22B, or an insulating core 22C, or a combination thereof. The first hydrogen supply layer 24 may serve to passivate defects existing in peripheral layers. The first hydrogen supply layer 24 may include hydrogen as a passivation source, and may supply hydrogen to the gate structure 21, the channel structures 22, or the electrode structures. The first hydrogen supply layer 24 may have a first hydrogen concentration. The first hydrogen supply layer 24 may include oxide, nitride, or oxynitride, or a combination thereof.

The first hydrogen supply layer 24 may include an oxygen vacancy OV. The oxygen vacancy OV may serve as a passage for supplying hydrogen to the gate structure 21, the channel structures 22, or the electrode structures. Referring to FIG. 2B, hydrogen (H) in the first hydrogen supply layer 24 may be supplied to the gate structure 21, the channel structures 22, or the electrode structures through the oxygen vacancy OV. By using the oxygen vacancy OV as a movement path of the hydrogen (H), the hydrogen (H) may be efficiently supplied.

The second hydrogen supply layer 27 may be disposed on the first hydrogen supply layer 24. The second hydrogen supply layer 27 may be disposed between the first hydrogen supply layer 24 and the hydrogen blocking layer 25. The second hydrogen supply layer 27 may serve to passivate defects existing in peripheral layers, and may serve as a passage for supplying hydrogen to the first hydrogen supply layer 24. The second hydrogen supply layer 27 may include hydrogen at a third hydrogen concentration. The third hydrogen concentration may be substantially the same as or different from the second hydrogen concentration of the hydrogen blocking layer 25. For example, the third hydrogen concentration may be higher than the second hydrogen concentration.

The second hydrogen supply layer 27 may include oxide, nitride, or oxynitride, or a combination thereof. For example, the first hydrogen supply layer 24 and the second hydrogen supply layer 27 may each include oxide, and the hydrogen blocking layer 25 may include nitride. In another example, the first hydrogen supply layer 24 and the second hydrogen supply layer 27 may each include oxynitride or nitride, and the hydrogen blocking layer 25 may include nitride. In another example, the first hydrogen supply layer 24 may include oxide, and the second hydrogen supply layer 27 and the hydrogen blocking layer 25 may include oxynitride or nitride. In another example, the first hydrogen supply layer 24 and the hydrogen blocking layer 25 may each include oxynitride or nitride, and the second hydrogen supply layer 27 may include oxide.

The second hydrogen supply layer 27 may include an oxygen vacancy OV. The oxygen vacancy OV of the second hydrogen supply layer 27 may serve as a passage for supplying hydrogen to the first hydrogen supply layer 24. Referring to FIG. 2B, hydrogen (H) included in the hydrogen blocking layer 25 may be moved to the second hydrogen supply layer 27, and the hydrogen (H) in the second hydrogen supply layer 27 may be moved to the first hydrogen supply layer 24 through the oxygen vacancy OV of the second hydrogen supply layer 27, and the hydrogen (H) in the first hydrogen supply layer 24 may be supplied to the gate structure 21, the channel structures 22, or the electrode structures through the oxygen vacancy OV of the first hydrogen supply layer 24.

The hydrogen blocking layer 25 may be disposed on the second hydrogen supply layer 27. The interconnection structure 26 may be located in the interlayer dielectric layer 23 on the hydrogen blocking layer 25, and the interconnection structure 26 may include contact plugs 26A to 26C and wiring lines 26D and 26E. The hydrogen blocking layer 25 serves to restrict a hydrogen movement path. The hydrogen blocking layer 25 may include hydrogen and have the second hydrogen concentration. Referring to FIG. 2B, the hydrogen (H) included in the hydrogen blocking layer 25 may be moved to the second hydrogen supply layer 27, and may be moved to the first hydrogen supply layer 24 through the oxygen vacancy OV in the second hydrogen supply layer 27. The hydrogen blocking layer may include nitride.

According to the structure described above, the hydrogen supply layer may be configured in a multilayer structure. The semiconductor device may include the second hydrogen supply layer 27 as well as the first hydrogen supply layer 24. The second hydrogen supply layer 27 may be disposed on the first hydrogen supply layer 24 to supply hydrogen to the first hydrogen supply layer 24. Accordingly, a larger amount of hydrogen may be supplied to the gate structure 21, the channel structures 22, or the electrode structures through hydrogen supplied from the second hydrogen supply layer 27 to the first hydrogen supply layer 24 and hydrogen included in the first hydrogen supply layer 24.

Figure 3A:
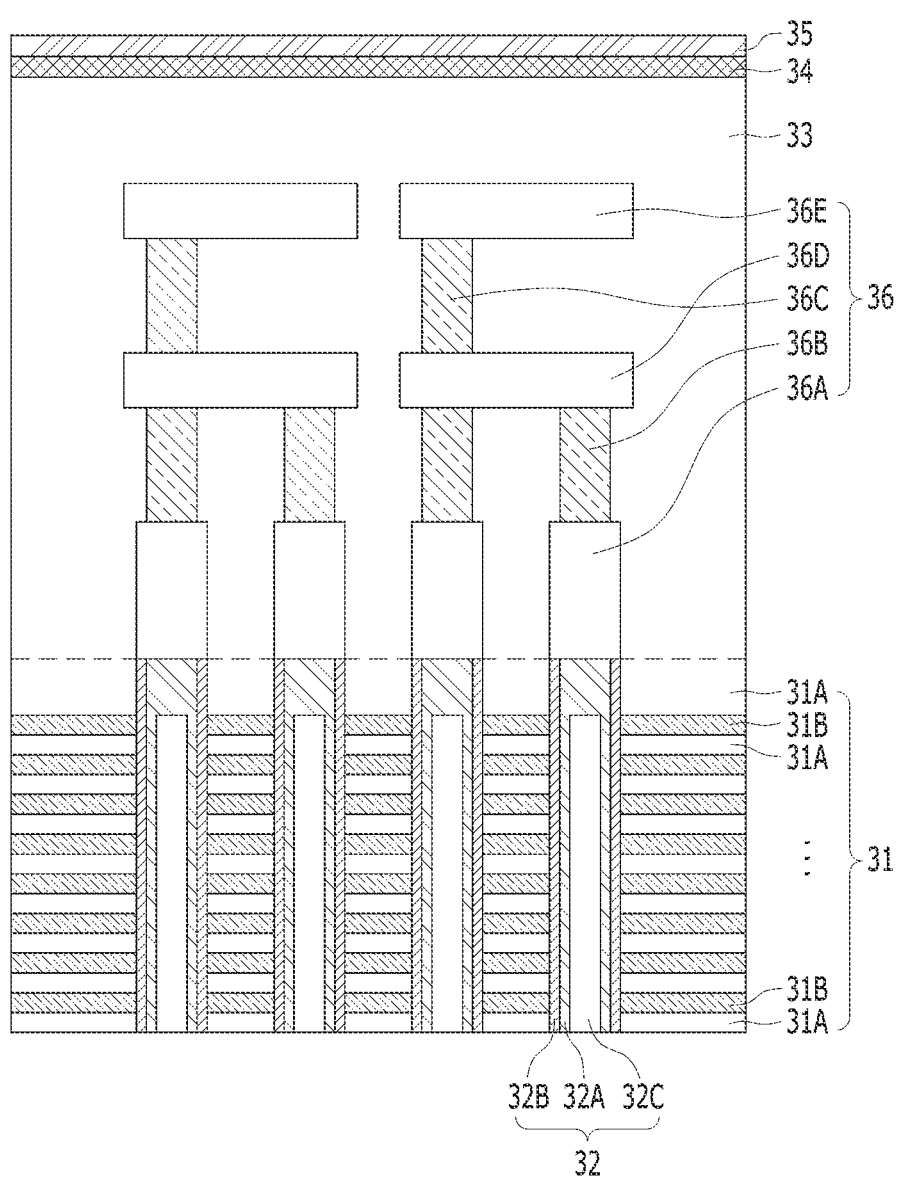
FIG. 3A to FIG. 3C are simplified schematic diagrams illustrating the structure of a semiconductor device in accordance with an embodiment.
Figure 3B:
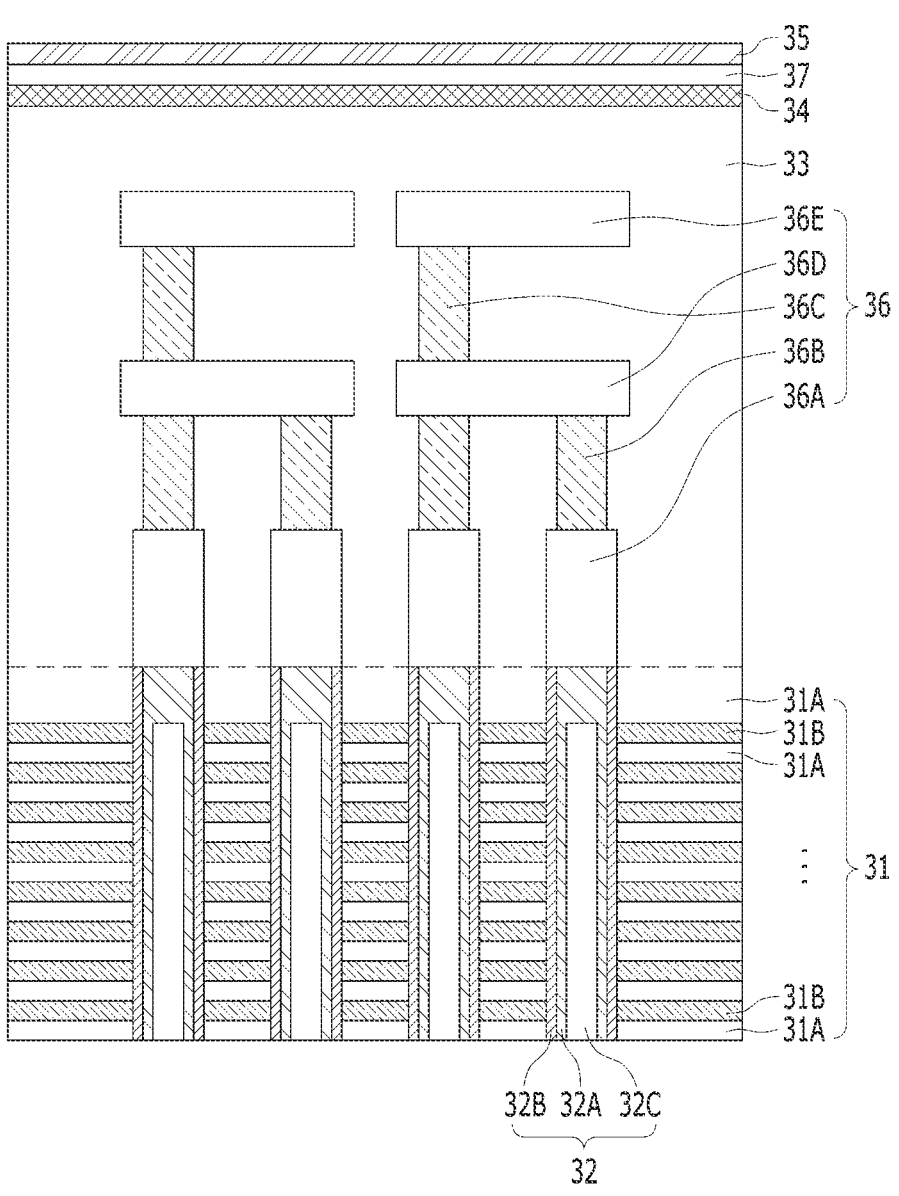
Figure 3C:
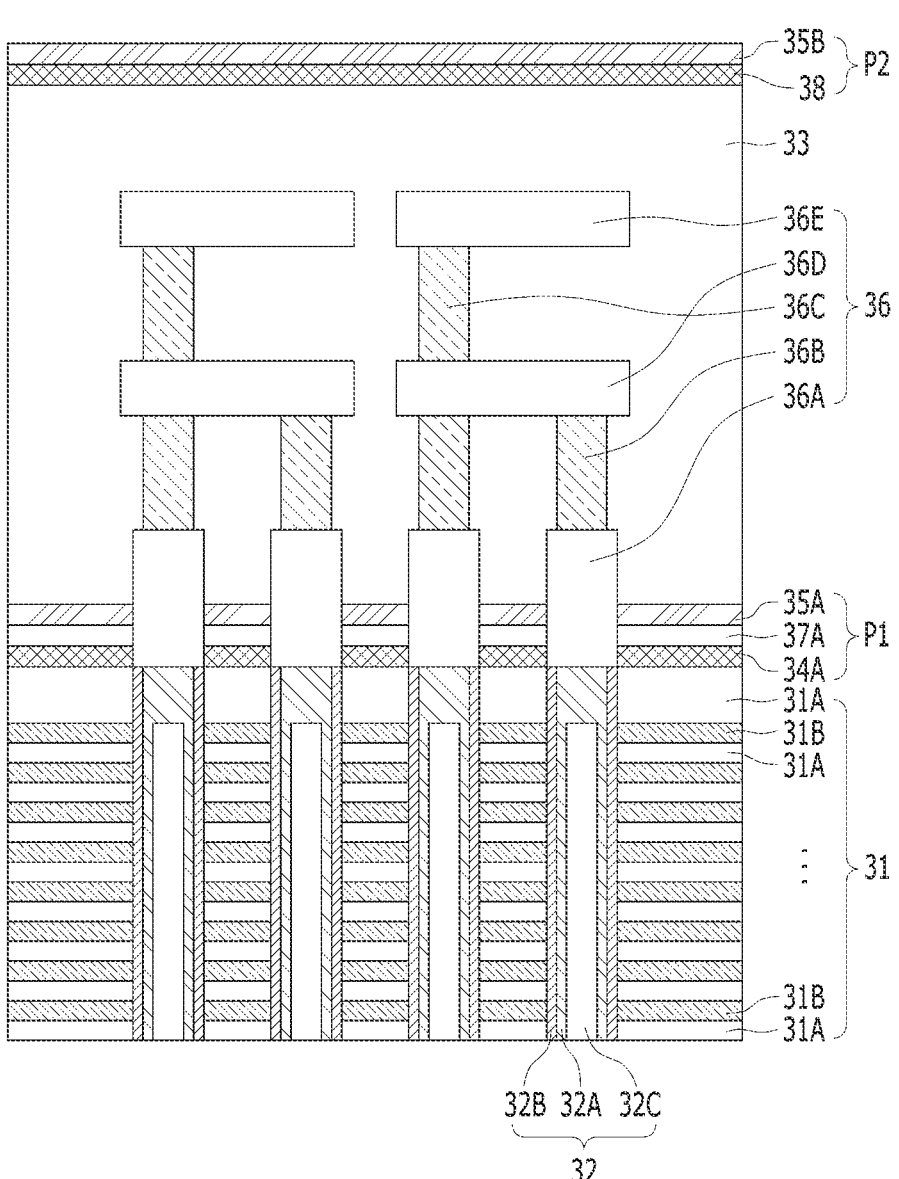

FIG. 3A to FIG. 3C are simplified schematic diagrams illustrating the structure of a semiconductor device in accordance with an embodiment. Hereinafter, content overlapping the previously described content may be omitted.

Referring to FIG. 3A and FIG. 3B, the semiconductor device may include a gate structure 31, channel structures 32, a first hydrogen supply layer 34, a second hydrogen supply layer 37, or a hydrogen blocking layer 35, or a combination thereof. The semiconductor device may further include an interlayer dielectric layer 33 or an interconnection structure 36, or a combination thereof.

Referring to FIG. 3A, the interconnection structure 36 may be disposed on the gate structure 31. The gate structure 31 may include insulating layers 31A and conductive layers 31B that are alternately stacked. The channel structure 32 may extend in the stacking direction of the insulating layers 31A through the gate structure 31. The channel structure 32 may include a channel layer 32A, a memory layer 32B, or an insulating core 32C, or a combination thereof. The interconnection structure 36 may be connected to the channel structures 32 or the electrode structures, and may supply a bias required for a program, read, or erase operation. The interconnection structure 36 may be located in the interlayer dielectric layer 33. The interconnection structure 36 may include contact plugs 36A to 36C or wiring lines 36D and 36E, or a combination thereof.

The first hydrogen supply layer 34 may be disposed on the interconnection structure 36. The interconnection structure 36 may be disposed between the gate structure 31 and the first hydrogen supply layer 34. The first hydrogen supply layer 34 may serve to passivate defects existing in peripheral layers. The first hydrogen supply layer 34 may include hydrogen as a passivation source, and may supply hydrogen to the interconnection structure 36. The hydrogen supplied to the interconnection structure 36 may serve to passivate defects in the interconnection structure 36 and the interlayer dielectric layer 33. Alternatively, by supplying hydrogen to the gate structure 31, the channel structure 32, or the electrode structures through the interconnection structure 36, defects in the corresponding structures may be passivated.

The first hydrogen supply layer 34 may have a first hydrogen concentration. The first hydrogen supply layer 34 may include oxide, nitride, or oxynitride, or a combination thereof. The first hydrogen supply layer 34 may include an oxygen vacancy (OV). The oxygen vacancy OV may serve as a passage for supplying hydrogen to the interconnection structure 36, the gate structure 31, the channel structure 32, or the electrode structures.

The hydrogen blocking layer 35 may be disposed on the first hydrogen supply layer 34. The hydrogen blocking layer 35 serves to restrict a hydrogen movement path. The hydrogen blocking layer 35 may include hydrogen and have a second hydrogen concentration. Accordingly, hydrogen in the hydrogen blocking layer 35 may be supplied to the first hydrogen supply layer 34. The hydrogen blocking layer 35 may include nitride.

Referring to FIG. 3B, the second hydrogen supply layer 37 may be disposed on the first hydrogen supply layer 34. The second hydrogen supply layer 37 may be disposed between the first hydrogen supply layer 34 and the hydrogen blocking layer 35. The second hydrogen supply layer 37 may serve to passivate defects existing in the peripheral layers and may serve as a passage for supplying hydrogen to the first hydrogen supply layer 34. The second hydrogen supply layer 37 may include hydrogen and have a third hydrogen concentration. The third hydrogen concentration may be substantially the same as or different from the second hydrogen concentration of the hydrogen blocking layer 35. For example, the third hydrogen concentration may be higher than the second hydrogen concentration. The second hydrogen supply layer 37 may include oxide, nitride, or oxynitride, or a combination thereof.

The second hydrogen supply layer 37 may include an oxygen vacancy OV. The oxygen vacancy OV of the second hydrogen supply layer 37 may serve as a passage for supplying hydrogen to the first hydrogen supply layer 34. For example, hydrogen (H) included in the hydrogen blocking layer 35 may be moved to the second hydrogen supply layer 37, the hydrogen (H) in the second hydrogen supply layer 37 may be moved to the first hydrogen supply layer 34 through the oxygen vacancy OV of the second hydrogen supply layer 37, and the hydrogen (H) in the first hydrogen supply layer 34 may be supplied to the interconnection structure 36, the gate structure 31, the channel structure 32, or the electrode structures through the oxygen vacancy OV of the first hydrogen supply layer 34.

The semiconductor device may further include the hydrogen supply layer 14 and the hydrogen blocking layer 15 described with reference to FIG. 1A to FIG. 1C, or may further include the first hydrogen supply layer 24, the second hydrogen supply layer 27, and the hydrogen blocking layer 25 described with reference to FIG. 2A or FIG. 2B, or may further include a combination thereof. Referring to FIG. 3C, the semiconductor device may include a first passivation structure P1 and a second passivation structure P2. The first passivation structure P1 may be disposed on the gate structure 31. The first passivation structure P1 may include a first hydrogen supply layer 34A, a second hydrogen supply layer 37A, or a first hydrogen blocking layer 35A, or a combination thereof. The first hydrogen supply layer 34A may correspond to the hydrogen supply layer 14 in FIG. 1A or the first hydrogen supply layer 24 in FIG. 2A. The second hydrogen supply layer 37A may correspond to the second hydrogen supply layer 27 in FIG. 2A. The first hydrogen blocking layer 35A may correspond to the hydrogen blocking layer 15 in FIG. 1A or the hydrogen blocking layer 25 in FIG. 2A. The first hydrogen supply layer 34A or the second hydrogen supply layer 37A may supply hydrogen to the gate structure 31, the channel structures 32, or the electrode structures. The first hydrogen blocking layer 35A may prevent hydrogen from diffusing into the interlayer dielectric layer 33.

The second passivation structure P2 may be disposed over the interconnection structure 36. The second passivation structure P2 may include a third hydrogen supply layer 38 or a second hydrogen blocking layer 35B, or a combination thereof. The third hydrogen supply layer 38 may correspond to the first hydrogen supply layer 34A, the hydrogen supply layer 14 in FIG. 1A, or the first hydrogen supply layer 24 in FIG. 2A. The second hydrogen blocking layer 35B may correspond to the first hydrogen blocking layer 35A, the hydrogen blocking layer 15 in FIG. 1A, or the hydrogen blocking layer 25 in FIG. 2A. The third hydrogen supply layer 38 may supply hydrogen to the interconnection structure 36. The second hydrogen blocking layer 35B may prevent hydrogen from diffusing to the outside.

However, the first passivation structure P1 and the second passivation structure P2 are not limited thereto, and may each be configured as a single layer or a multilayer. For example, the first passivation structure P1 may include a double layer structure including the first hydrogen supply layer 34A and the first hydrogen blocking layer 35A, and the second passivation structure P2 may include a triple layer structure including the third hydrogen supply layer 38, a fourth hydrogen supply layer, and the second hydrogen blocking layer 35B.

According to the structure described above, the first hydrogen supply layer 34 and the second hydrogen supply layer 37 may supply hydrogen to the interconnection structure 36, the gate structure 31, the channel structures 32, or the electrode structures, thereby passivating defects in the corresponding structures. Furthermore, by locating both the first passivation structure P1 and the second passivation structure P2 in the semiconductor device, defects in the semiconductor device may be effectively passivated.

Figure 4A:
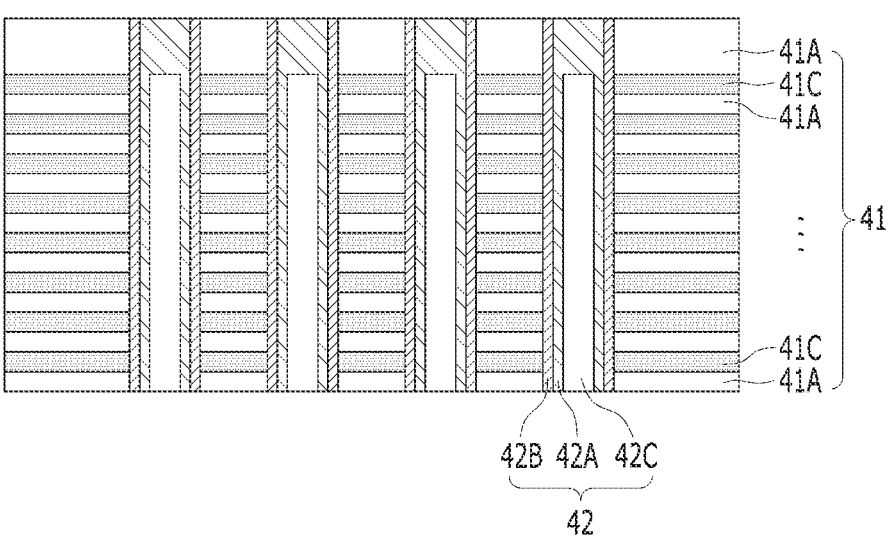
FIG. 4A to FIG. 4F are simplified schematic diagrams for describing a manufacturing method of a semiconductor device in accordance with an embodiment.
Figure 4B:
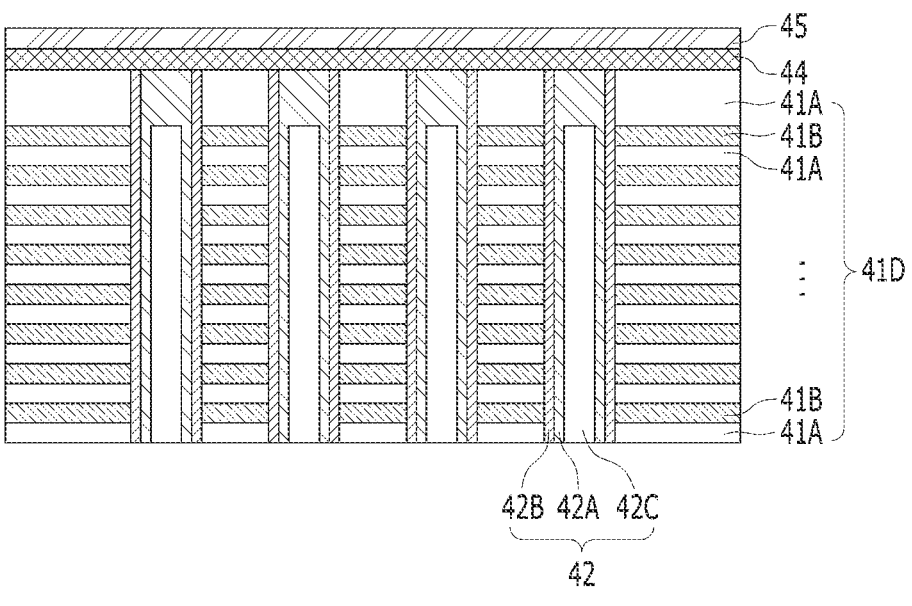
Figure 4C:
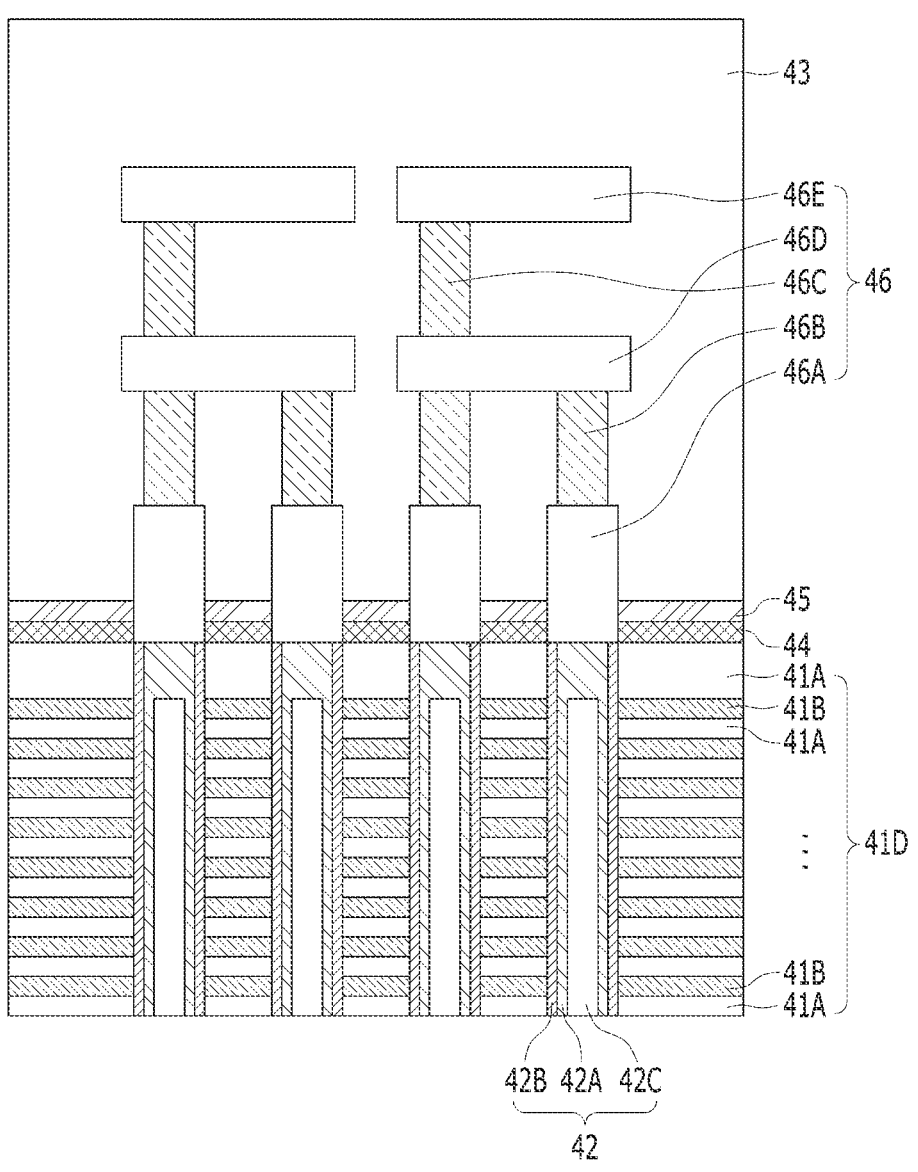
Figure 4D:
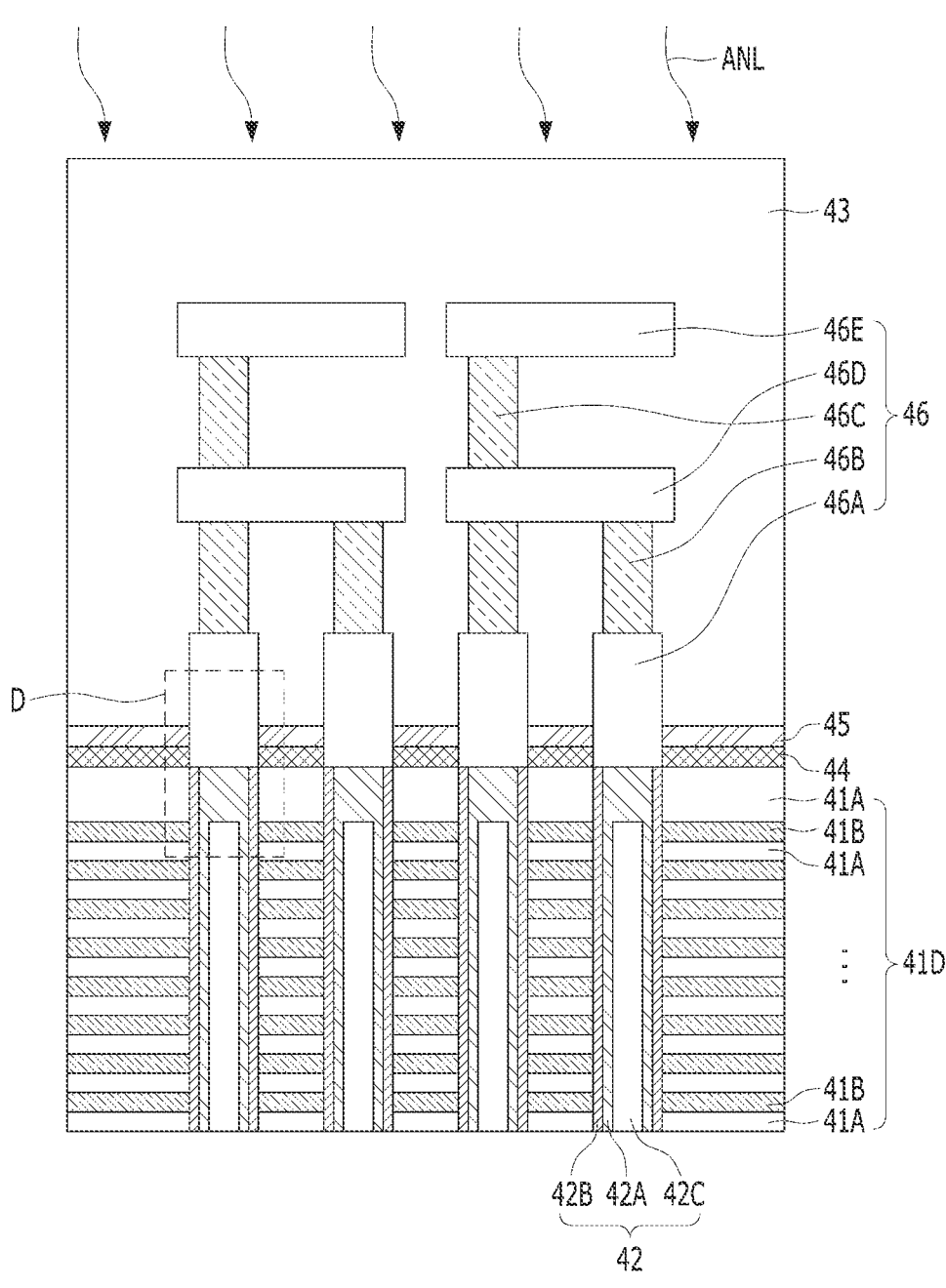
Figure 4E:
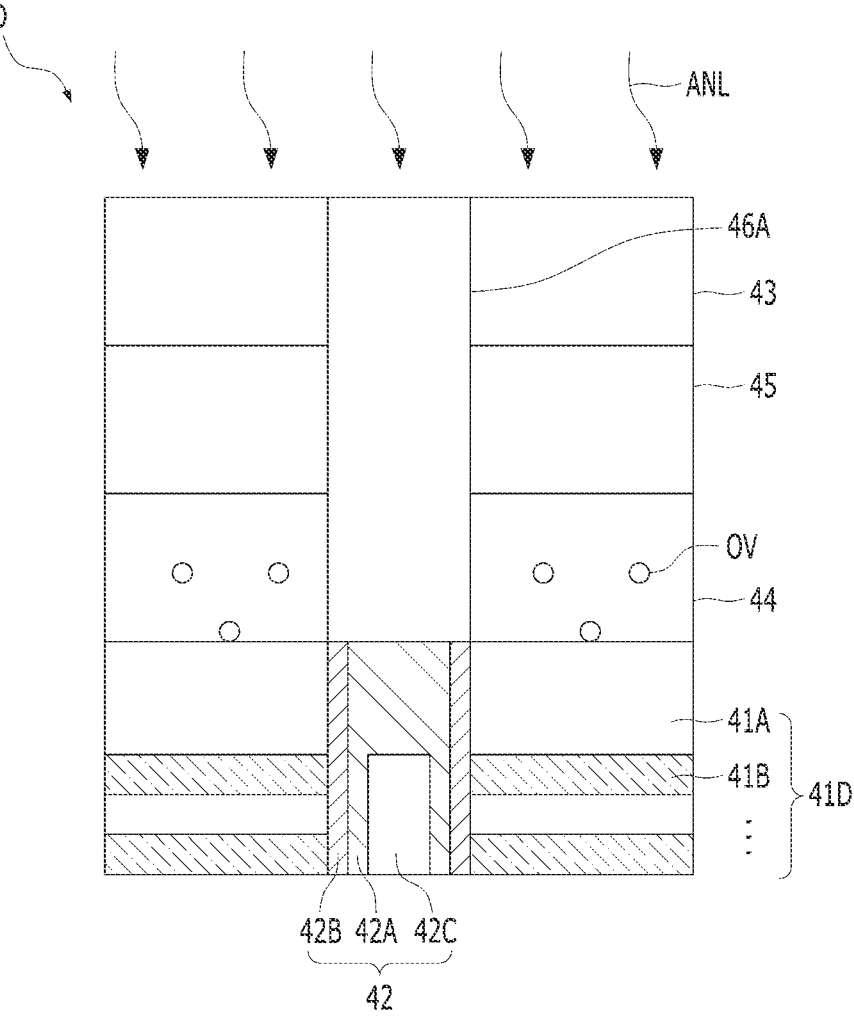
Figure 4F:
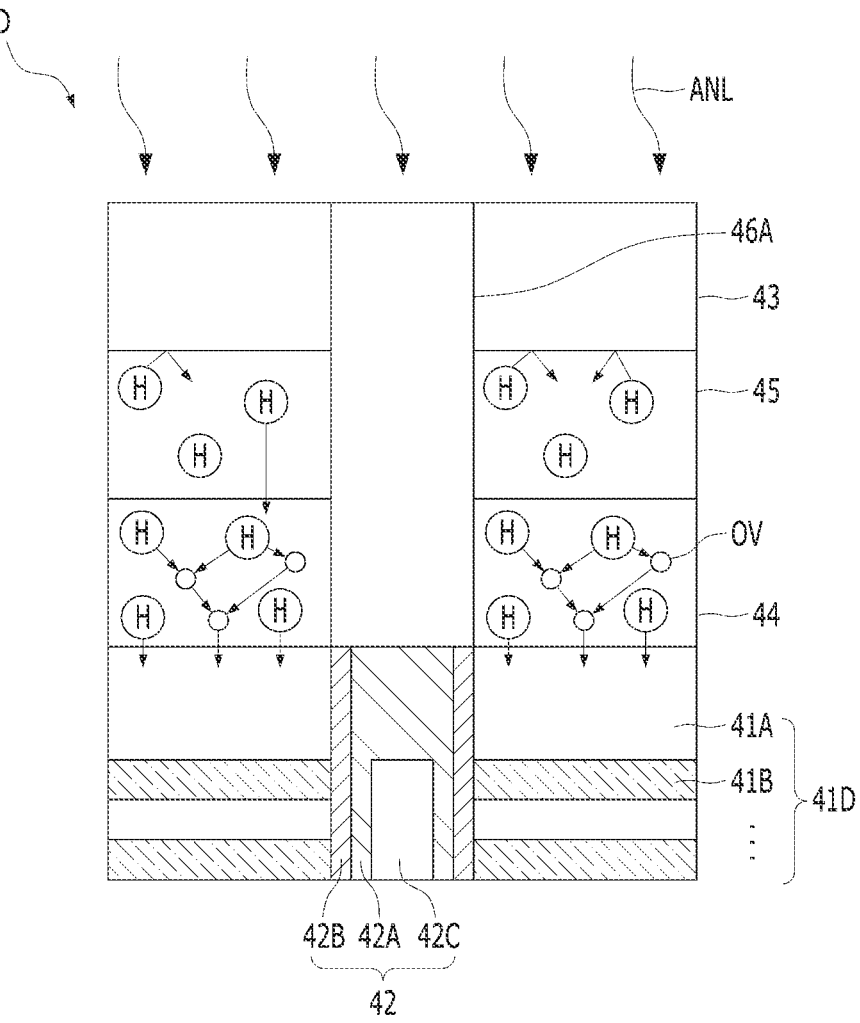

FIG. 4A to FIG. 4F are simplified schematic diagrams for describing a manufacturing method of a semiconductor device in accordance with an embodiment. FIG. 4A to FIG. 4D may be cross-sectional views, and FIG. 4E to FIG. 4F are enlarged views for a region D in FIG. 4D. Hereinafter, content overlapping the previously described content may be omitted.

Referring to FIG. 4A, a stack 41 may be formed. The stack 41 may include first material layers 41A and second material layers 41C that are alternately stacked. The first material layers 41A may each include an insulating material such as oxide, and the second material layers 41C may each include a sacrificial material such as nitride or a conductive material such as polysilicon, tungsten, or molybdenum.

Subsequently, channel structures 42 may be formed in the stack 41. The channel structures 42 may extend in the stacking direction of the first material layers 41A through the stack 41. Each of the channel structures 42 may include a channel layer 42A passing through the stack 41. Each of the channel structures 42 may further include at least one of a memory layer 42B surrounding a sidewall of the channel layer 42A or an insulating core 42C in the channel layer 42A. The memory layer 42B may include a blocking layer, a data storage layer, or a tunneling layer, or a combination thereof. The data storage layer may include a floating gate, a polysilicon layer, a charge trap material, a nitride layer, a variable resistance material, or the like. The insulating core 42C may include an insulating material such as oxide, nitride, or air gap.

Referring to FIG. 4B, a hydrogen supply layer 44 may be formed on the stack 41. The hydrogen supply layer 44 may serve to passivate defects existing in peripheral layers. The hydrogen supply layer 44 may have a first hydrogen concentration. The hydrogen supply layer 44 may include oxide, nitride, or oxynitride, or a combination thereof.

Subsequently, a hydrogen blocking layer 45 may be formed on the hydrogen supply layer 44. The hydrogen blocking layer 45 serves to restrict a hydrogen movement path. The hydrogen blocking layer may include hydrogen and have a second hydrogen concentration. The second hydrogen concentration may be substantially the same as or different from the first hydrogen concentration. For example, the second hydrogen concentration may be lower than the first hydrogen concentration. The hydrogen blocking layer 45 may include nitride.

Subsequently, the stack 41 may be replaced with a gate structure 41D. The second material layers 41C of the stack 41 may be replaced with third material layers 41B. The third material layers 41B may serve as gate lines such as word lines and select lines. For example, when the first material layers 41A each include an insulating material and the second material layers 41C each include a sacrificial material, the second material layers 41C may be replaced with conductive layers. The conductive layers may each include a conductive material such as polysilicon, tungsten, or molybdenum. When the first material layers 41A each includes an insulating material and the second material layers 41C each includes a conductive material, the second material layers 41C may be silicified. In some embodiments, when the second material layers 41C each include a conductive material such as a metal, the second material layers 41C may each be used as a gate line as is. Accordingly, the gate structure 41D including the first material layers 41A and the third material layers 41B that are alternately stacked may be formed.

In some embodiments, a case where the hydrogen supply layer 44 and the hydrogen blocking layer 45 are formed and then the stack 41 is replaced with the gate structure 41D has been described; however, the hydrogen supply layer 44 and the hydrogen blocking layer 45 may be formed after the stack 41 is replaced with the gate structure 41D.

Referring to FIG. 4C, an interconnection structure 46 may be formed on the gate structure 41D. The interconnection structure 46 may be formed in an interlayer dielectric layer 43. The interconnection structure 46 may include contact plugs 46A to 46C and wiring lines 46D and 46E. First, first contact plugs 46A may be formed to be connected to the channel structures 42, respectively, through the hydrogen blocking layer 45 and the hydrogen supply layer 44. Subsequently, second contact plugs 46B and first wiring lines 46D may be formed on the first contact plugs 46A. The first wiring line 46D and the first contact plug 46A may be connected to each other by the second contact plug 46B. Subsequently, third contact plugs 46C and second wiring lines 46E may be formed on the first wiring lines 46D. The second contact plugs 46B and the third contact plug 46C may be connected to each other by the first wiring lines 46D, respectively. The first wiring line 46D and the second wiring line 46E may be connected to each other by the third contact plug 46C. The contact plugs 46A to 46C or the wiring lines 46D and 46E may each include a conductive material such as aluminum, copper, or tungsten.

Referring to FIG. 4D, an annealing (ANL) process may be performed. For example, the hydrogen blocking layer 45 and the hydrogen supply layer 44 may be annealed. Furthermore, hydrogen in the hydrogen supply layer 44 or the hydrogen blocking layer 45 may be supplied to a peripheral layer by the annealing (ANL) process.

The process in which the hydrogen is transferred is as follows. Referring to FIG. 4E, an oxygen vacancy OV may be formed in the hydrogen supply layer 44 or the hydrogen blocking layer 45 by the annealing (ANL) process. For example, the oxygen vacancy OV may be formed by releasing oxygen included in the hydrogen supply layer 44. The oxygen vacancies OV of the hydrogen supply layer 44 and the hydrogen blocking layer 45 may serve as passages for supplying hydrogen to the gate structure 41D, the channel structure 42, or the electrode structures. Referring to FIG. 4F, hydrogen (H) in the hydrogen supply layer 44 may be supplied to the gate structure 41D, the channel structure 42 or the electrode structures through the oxygen vacancy OV.

In some embodiments, in the present embodiment, a case where the annealing (ANL) process is performed after the interconnection structure 46 is formed has been described; however, the annealing (ANL) process may be performed before the interconnection structure 46 is formed. The annealing (ANL) process may be performed one or more times. For, example, in some embodiments, the annealing (ANL) process may be performed both before and after the interconnection structure 46 is formed. Furthermore, after the annealing (ANL) process, the hydrogen supply layer 44 and the hydrogen blocking layer 45 may be maintained or removed.

According to the manufacturing method described above, hydrogen (H) may be efficiently supplied by using the oxygen vacancy (OV) as a movement path of hydrogen (H). Accordingly, defects such as dangling bonds existing in the gate structure 41D, the channel structure 42, or the electrode structures may be passivated with hydrogen, and operating characteristics of the semiconductor device may be improved by improving a cell current, a cell distribution, or the like.

Figure 5:
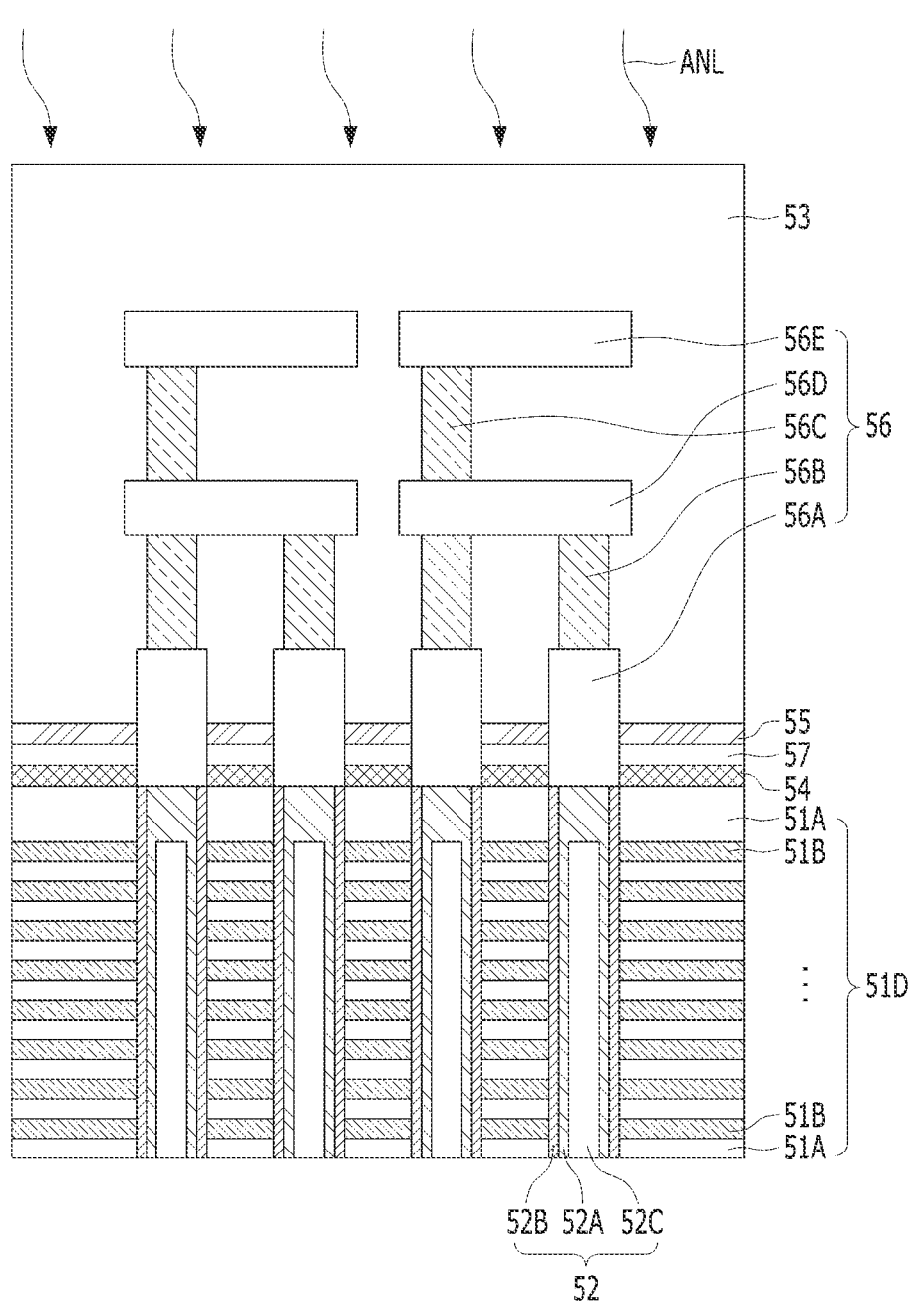
FIG. 5 is a simplified schematic diagram for describing a manufacturing method of a semiconductor device in accordance with an embodiment.

FIG. 5 is a simplified schematic diagram for describing a manufacturing method of a semiconductor device in accordance with an embodiment. Hereinafter, content overlapping the previously described content may be omitted.

Referring to FIG. 5, a gate structure 51D may be formed. The gate structure 51D may include Insulating layers 51A and conductive layers 51B that are alternately stacked. A plurality of channel structures 52 may be formed to be spaced apart from each other, and passing through the gate structure 51D. The channel structures 52 may include a channel layer 52A, a memory layer 52B, or an insulating core 52C, or a combination thereof.

Subsequently, a first hydrogen supply layer 54 may be formed on the gate structure 51D. The first hydrogen supply layer 54 may serve to passivate defects existing in peripheral layers. The first hydrogen supply layer 54 may include hydrogen as a passivation source and have a first hydrogen concentration. The first hydrogen supply layer 54 may include oxide, nitride, or oxynitride, or a combination thereof. In some embodiments, a hydrogen supply layer may be further formed on a second hydrogen supply layer 57.

Subsequently, the second hydrogen supply layer 57 may be formed on the first hydrogen supply layer 54. The second hydrogen supply layer 57 may serve to passivate defects existing in the peripheral layers, and may serve as a passage for supplying hydrogen to the first hydrogen supply layer 54. The second hydrogen supply layer 57 may include hydrogen and have a third hydrogen concentration. The second hydrogen supply layer 57 may include oxide, nitride, or oxynitride, or a combination thereof.

Subsequently, a hydrogen blocking layer 55 may be formed on the second hydrogen supply layer 57. The hydrogen blocking layer 55 serves to restrict a hydrogen movement path. The hydrogen blocking layer 55 may include hydrogen and have a second hydrogen concentration. The second hydrogen concentration may be substantially the same as or different from the first hydrogen concentration or the third hydrogen concentration. For example, the second hydrogen concentration may be lower than the first hydrogen concentration, and may be lower than the third hydrogen concentration. The hydrogen blocking layer 55 may include nitride.

Subsequently, an interconnection structure 56 may be formed. The interconnection structure 56 may be formed in an interlayer dielectric layer 53, and may include contact plugs 56A to 56C and wiring lines 56D and 56E.

Subsequently, an annealing (ANL) process may be performed. For example, the hydrogen blocking layer 55, the second hydrogen supply layer 57, and the first hydrogen supply layer 54 may be annealed. An oxygen vacancy OV may be formed in the hydrogen blocking layer 55, the second hydrogen supply layer 57, or the first hydrogen supply layer 54 by the annealing (ANL) process. The oxygen vacancy OV may serve as a passage for supplying hydrogen to the gate structure 51D, the channel structures 52, or the electrode structures. For example, hydrogen in the hydrogen blocking layer 55 may be supplied to the second hydrogen supply layer 57 through the oxygen vacancy OV, and the hydrogen in the second hydrogen supply layer 57 may be supplied to the first hydrogen supply layer 54. The hydrogen supplied to the first hydrogen supply layer 54 may be supplied to the gate structure 51D, the channel structure 52, or the electrode structures. Accordingly, defects may be passivated by the hydrogen in the first hydrogen supply layer 54 and the hydrogen supplied from the second hydrogen supply layer 57.

According to the manufacturing method described above, the hydrogen supply layer may be formed in a multilayer structure. Accordingly, defects in the gate structure 51D, the channel structure 52, or the electrode structures may be passivated by hydrogen supplied from the multi-layer hydrogen supply layer including the first hydrogen supply layer 54 and the second hydrogen supply layer 57.

Figure 6:
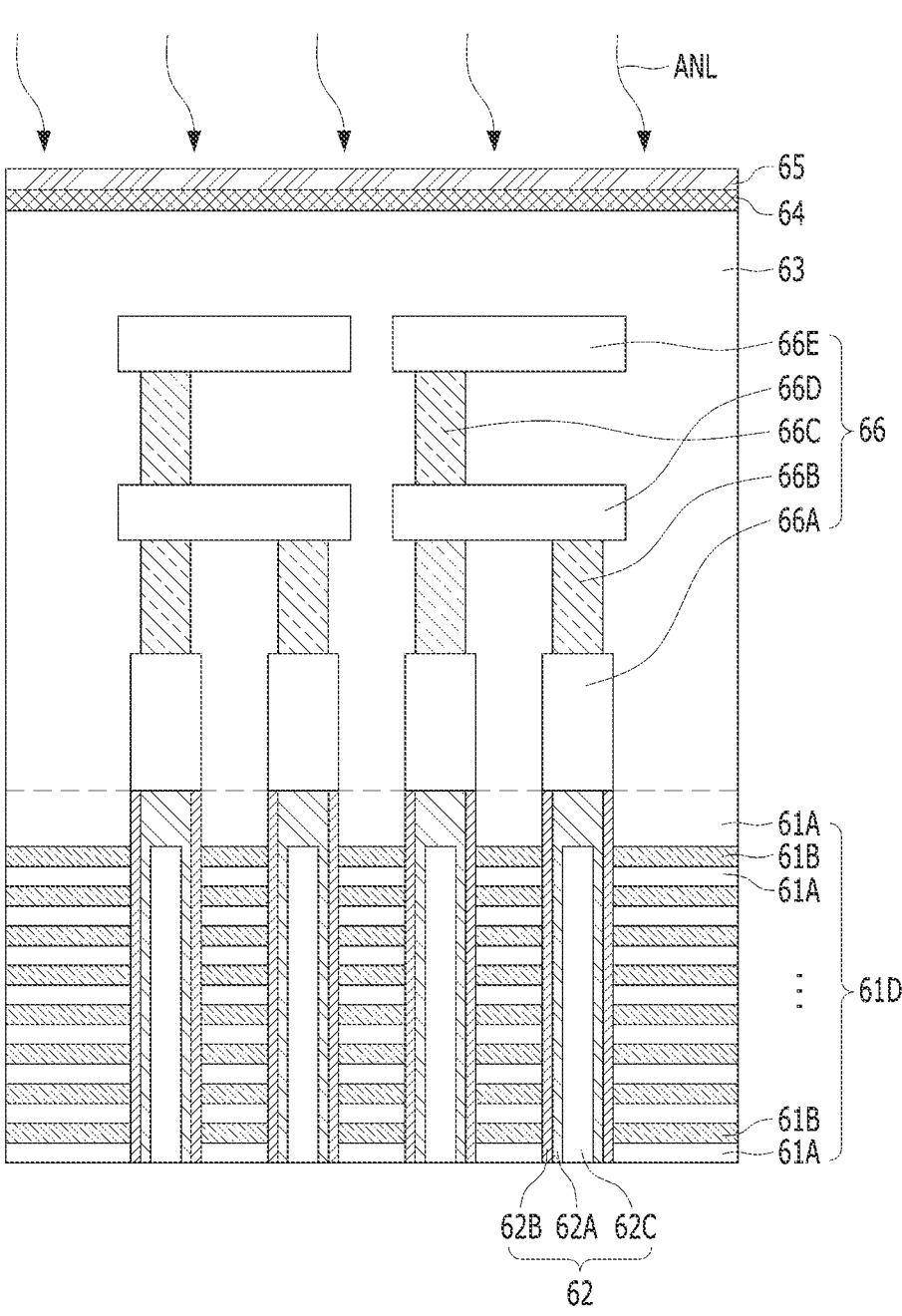
FIG. 6 is a simplified schematic diagram for describing a manufacturing method of a semiconductor device in accordance with an embodiment.

FIG. 6 is a simplified schematic diagram for describing a manufacturing method of a semiconductor device in accordance with an embodiment. Hereinafter, content overlapping the previously described content may be omitted.

Referring to FIG. 6, a gate structure 61D may be formed. The gate structure 61D may include insulating layers 61A and conductive layers 61B that are alternately stacked, and channel structures 62 may be formed to be spaced apart from each other and passing through the gate structure 61D. The channel structures 62 may each include a channel layer 62A, a memory layer 62B, or an insulating core 62C, or a combination thereof.

Subsequently, an interconnection structure 66 may be formed on the gate structure 61D. The interconnection structure 66 may be located in an interlayer dielectric layer 63, and may include contact plugs 66A to 66C and wiring lines 66D and 66E.

Subsequently, a hydrogen supply layer 64 and a hydrogen blocking layer 65 may be formed over the interconnection structure 66. The hydrogen supply layer 64 is used to passivate defects existing in peripheral layers, and the hydrogen blocking layer 65 serves to restrict a hydrogen movement path. The hydrogen supply layer 64 may include hydrogen as a passivation source and have a first hydrogen concentration. The hydrogen blocking layer 65 may have a second hydrogen concentration, and the second hydrogen concentration may be substantially the same as or different from the first hydrogen concentration. The hydrogen supply layer 64 may be formed as a single layer or a multilayer.

The hydrogen supply layer 64 may supply hydrogen to the interconnection structure 66. The hydrogen supplied to the interconnection structure 66 may passivate defects in the interconnection structure 66 and the interlayer dielectric layer 63. Alternatively, by supplying hydrogen to the gate structure 61D, the channel structure 62, or the electrode structures through the interconnection structure 66, defects in the corresponding structures may be passivated.

Subsequently, an annealing (ANL) process may be performed. For example, the hydrogen blocking layer 65 and the hydrogen supply layer 64 may be annealed. An oxygen vacancy OV may be formed in the hydrogen supply layer 64 or the hydrogen blocking layer 65 by the annealing (ANL) process. For example, the oxygen vacancy OV may be formed by releasing oxygen included in the hydrogen supply layer 64 or the hydrogen blocking layer 65. The oxygen vacancy OV may serve as a passage for supplying hydrogen to the interconnection structure 66, the gate structure 61D, the channel structure 62, or the electrode structures.

In manufacturing the semiconductor device, the hydrogen supply layer 44 and the hydrogen blocking layer 45 described with reference to FIG. 4A to FIG. 4D may be further formed, or the first hydrogen supply layer 54, the second hydrogen supply layer 57, and the hydrogen blocking layer 55 described with reference to FIG. 5 may be formed, or a combination thereof may be further formed. For example, before the interconnection structure 66 is formed, a hydrogen supply layer and a hydrogen blocking layer may be formed, or a first hydrogen supply layer, a second hydrogen supply layer, and a hydrogen blocking layer may be formed. Accordingly, a semiconductor device including a first passivation structure and a second passivation structure may be manufactured.

According to the manufacturing method described above, defects in the interconnection structure 66, the gate structure 61D, the channel structure 62, or the electrode structures may be passivated by hydrogen supplied from the hydrogen supply layer 64.

Although embodiments according to the technical idea of the present invention disclosure have been described above with reference to the accompanying drawings, this is only for explaining the embodiments according to the concept of the present invention disclosure, and the present invention disclosure is not limited to the above embodiments. Various types of substitutions, modifications, and changes for the embodiments may be made by those skilled in the art, to which the present invention disclosure pertains, without departing from the technical idea of the present invention disclosure defined in the following claims, and it should be construed that these substitutions, modifications, and changes belong to the scope of the present invention disclosure.

What is claimed is:

1. A semiconductor device comprising:
a gate structure comprising insulating layers and conductive layers that are alternately stacked;
a channel structure extending through the gate structure and comprising a channel layer and a memory layer surrounding the channel layer;
a first hydrogen supply layer disposed over the gate structure, having a first hydrogen concentration, and comprising an oxygen vacancy; and
a hydrogen blocking layer disposed on the first hydrogen supply layer and having a second hydrogen concentration lower than the first hydrogen concentration.

2. The semiconductor device of claim 1, further comprising:
a second hydrogen supply layer disposed between the first hydrogen supply layer and the hydrogen blocking layer and having a third hydrogen concentration higher than the second hydrogen concentration.

3. The semiconductor device of claim 2, wherein the second hydrogen supply layer comprises an oxygen vacancy.

4. The semiconductor device of claim 2, wherein the second hydrogen supply layer comprises oxide or nitride.

5. The semiconductor device of claim 1, wherein the first hydrogen supply layer comprises oxide or nitride, and the hydrogen blocking layer comprises nitride.

6. The semiconductor device of claim 1, further comprising:
an interconnection structure disposed between the gate structure and the first hydrogen supply layer.

7. A semiconductor device comprising:
a gate structure comprising insulating layers and conductive layers that are alternately stacked;
a channel structure extending through the gate structure and comprising a channel layer and a memory layer surrounding the channel layer;
a first hydrogen supply layer disposed over the gate structure and having a first hydrogen concentration;
a hydrogen blocking layer disposed on the first hydrogen supply layer and having a second hydrogen concentration lower than the first hydrogen concentration; and
a second hydrogen supply layer disposed between the first hydrogen supply layer and the hydrogen blocking layer and having a third hydrogen concentration higher than the second hydrogen concentration.

8. The semiconductor device of claim 7, wherein at least one of the first hydrogen supply layer and the second hydrogen supply layer comprises an oxygen vacancy.

9. The semiconductor device of claim 7, wherein the first hydrogen supply layer comprises oxide or nitride, the second hydrogen supply layer comprises oxide or nitride, and the hydrogen blocking layer comprises nitride.

10. The semiconductor device of claim 7, further comprising:
an interconnection structure disposed between the gate structure and the first hydrogen supply layer.

11. A semiconductor device comprising:
a gate structure comprising insulating layers and conductive layers that are alternately stacked;
a plurality of channel structures passing through the gate structure and comprising a channel layer and a memory layer surrounding the channel layer;
a first hydrogen supply layer disposed over the gate structure, having a first hydrogen concentration, and comprising an oxygen vacancy; and
a second hydrogen supply layer disposed on the first hydrogen supply layer,
wherein the second hydrogen supply layer comprises an oxygen vacancy.

12. The semiconductor device of 11, further comprising:
a hydrogen blocking layer disposed on the first hydrogen supply layer and having a second hydrogen concentration lower than the first hydrogen concentration.

13. The semiconductor device of 12, wherein the second hydrogen supply layer having a third hydrogen concentration higher than the second hydrogen concentration.

14. The semiconductor device of 12, wherein the first hydrogen supply layer comprises oxide or nitride, the second hydrogen supply layer comprises oxide or nitride, and the hydrogen blocking layer comprises nitride.

* * * * *